(12) United States Patent
Takahashi et al.

(10) Patent No.: US 10,666,226 B2
(45) Date of Patent: May 26, 2020

(54) LADDER-TYPE FILTER, PIEZOELECTRIC THIN FILM RESONATOR, AND METHOD OF FABRICATING THE SAME

(71) Applicant: TAIYO YUDEN CO., LTD., Tokyo (JP)

(72) Inventors: Yuki Takahashi, Tokyo (JP); Hiroomi Kaneko, Tokyo (JP); Hiroshi Kawakami, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 65 days.

(21) Appl. No.: 16/132,820

(22) Filed: Sep. 17, 2018

(65) Prior Publication Data

US 2019/0115901 A1  Apr. 18, 2019

(30) Foreign Application Priority Data

Oct. 18, 2017  (JP) .................. 2017-201772

(51) Int. Cl.
*H03H 9/60* (2006.01)
*H03H 9/02* (2006.01)
(Continued)

(52) U.S. Cl.
CPC .............. *H03H 9/605* (2013.01); *H03H 3/02* (2013.01); *H03H 9/02015* (2013.01);
(Continued)

(58) Field of Classification Search
CPC ........... H03H 9/02015; H03H 9/02118; H03H 9/173; H03H 9/205; H03H 9/564;
(Continued)

(56) References Cited

U.S. PATENT DOCUMENTS

2002/0153965 A1  10/2002  Ruby et al.
2005/0237129 A1  10/2005  Kawamura
(Continued)

FOREIGN PATENT DOCUMENTS

JP  2003-22074 A  1/2003
JP  2004-173236 A  6/2004
(Continued)

*Primary Examiner* — Barbara Summons
(74) *Attorney, Agent, or Firm* — Chen Yoshimura LLP

(57) ABSTRACT

A ladder-type filter includes: a first piezoelectric thin film resonator including a first lower electrode, a first piezoelectric film, a first upper electrode, and an insertion film inserted between the first lower and upper electrodes, the insertion film being located in an outer peripheral region of a first resonance region; a second piezoelectric thin film resonator including a second lower electrode, a second piezoelectric film, and a second upper electrode, the second piezoelectric thin film resonator having no insertion film between the second lower and upper electrodes in a second resonance region; a series resonator, at least one of the series resonator being a first resonator that is one of the first and second piezoelectric thin film resonators, and a parallel resonator, at least one of the parallel resonator being a second resonator that is another of the first and second piezoelectric thin film resonators.

10 Claims, 14 Drawing Sheets

(51) Int. Cl.
   *H03H 9/205* (2006.01)
   *H03H 9/17* (2006.01)
   *H03H 9/56* (2006.01)
   *H03H 3/02* (2006.01)

(52) U.S. Cl.
   CPC ........ *H03H 9/02118* (2013.01); *H03H 9/173* (2013.01); *H03H 9/205* (2013.01); *H03H 9/564* (2013.01); *H03H 9/568* (2013.01); *H03H 2003/021* (2013.01)

(58) Field of Classification Search
   CPC ........ H03H 9/568; H03H 9/605; H03H 9/706; H03H 3/02; H03H 2003/021
   USPC .......................................................... 333/189
   See application file for complete search history.

(56) References Cited

U.S. PATENT DOCUMENTS

| | | | |
|---|---|---|---|
| 2005/0269904 A1* | 12/2005 | Oka | H03H 3/02 310/324 |
| 2007/0252476 A1* | 11/2007 | Iwaki | H03H 3/04 310/320 |
| 2007/0279154 A1 | 12/2007 | Taniguchi et al. | |
| 2010/0033063 A1* | 2/2010 | Nishihara | H03H 9/02118 310/365 |
| 2012/0218060 A1* | 8/2012 | Burak | H03H 9/584 333/191 |
| 2014/0210570 A1 | 7/2014 | Nishihara et al. | |
| 2015/0130559 A1 | 5/2015 | Yokoyama et al. | |
| 2015/0130561 A1 | 5/2015 | Taniguchi et al. | |
| 2015/0171826 A1 | 6/2015 | Sakashita et al. | |
| 2015/0207490 A1* | 7/2015 | Taniguchi | H03H 9/706 333/133 |
| 2016/0028371 A1 | 1/2016 | Nishihara et al. | |
| 2016/0142038 A1 | 5/2016 | Taniguchi et al. | |
| 2017/0033769 A1 | 2/2017 | Yokoyama | |
| 2017/0214388 A1 | 7/2017 | Irieda et al. | |
| 2017/0257076 A1* | 9/2017 | Kaneko | H03H 9/173 |
| 2018/0205360 A1* | 7/2018 | Han | H03H 9/02015 |
| 2018/0294794 A1* | 10/2018 | Liu | H03H 9/175 |
| 2018/0375489 A1* | 12/2018 | Tanaka | H03H 9/02015 |
| 2019/0007029 A1* | 1/2019 | Ishida | H03H 9/02015 |

FOREIGN PATENT DOCUMENTS

| | | |
|---|---|---|
| JP | 2005-223808 A | 8/2005 |
| JP | 2007-324823 A | 12/2007 |
| JP | 2009-27554 A | 2/2009 |
| JP | 2014-161001 A | 9/2014 |
| JP | 2015-95728 A | 5/2015 |
| JP | 2015-95729 A | 5/2015 |
| JP | 2015-119249 A | 6/2015 |
| JP | 2016-29766 A | 3/2016 |
| JP | 2016-96466 A | 5/2016 |
| JP | 2017-34358 A | 2/2017 |
| JP | 2017-135463 A | 8/2017 |

\* cited by examiner

LADDER-TYPE FILTER, PIEZOELECTRIC THIN FILM RESONATOR, AND METHOD OF FABRICATING THE SAME

CROSS-REFERENCE TO RELATED APPLICATION

This application is based upon and claims the benefit of priority of the prior Japanese Patent Application No. 2017-201772, filed on Oct. 18, 2017, the entire contents of which are incorporated herein by reference.

FIELD

A certain aspect of the present invention relates to a ladder-type filter, a piezoelectric thin film resonator, and a method of fabricating the same.

BACKGROUND

Ladder-type filters including piezoelectric thin film resonators have been used as filters and duplexers for wireless devices such as, for example, mobile phones. In the piezoelectric thin film resonator, a lower electrode, a piezoelectric film, and an upper electrode are stacked on a substrate. The region where the lower electrode and the upper electrode face each other across at least a part of the piezoelectric film is a resonance region. It has been known to insert an insertion film between the lower electrode and the upper electrode in the outer peripheral region within the resonance region and not to insert the insertion film in the center region of the resonance region as disclosed in, for example, Japanese Patent Application Publication Nos. 2015-95729, 2016-29766, and 2017-34358 (hereinafter, referred to as Patent Documents 1 through 3, respectively). It has been known to use the piezoelectric thin film resonator for the ladder-type filter as disclosed in, for example, Japanese Patent Application Publication Nos. 2003-22074, 2004-173236, 2005-223808, and 2007-324823 (hereinafter, referred to as Patent Documents 4 through 7, respectively).

SUMMARY OF THE INVENTION

According to a first aspect of the present invention, there is provided a ladder-type filter including: a substrate; a first piezoelectric thin film resonator including a first lower electrode located on the substrate, a first piezoelectric film located on the first lower electrode, a first upper electrode located on the first piezoelectric film, and an insertion film inserted between the first lower electrode and the first upper electrode, the insertion film being located in an outer peripheral region of a first resonance region in which the first lower electrode and the first upper electrode face each other across at least a part of the first piezoelectric film, the insertion film being not located in a center region of the first resonance region; a second piezoelectric thin film resonator including a second lower electrode located on the substrate, a second piezoelectric film located on the second lower electrode, and a second upper electrode located on the second piezoelectric film, the second piezoelectric thin film resonator having no insertion film between the second lower electrode and the second upper electrode in a second resonance region in which the second lower electrode and the second upper electrode face each other across at least a part of the second piezoelectric film; one or more series resonators connected in series between an input terminal and an output terminal, at least one series resonator of the one or more series resonators being a first resonator that is one of the first piezoelectric thin film resonator and the second piezoelectric thin film resonator; and one or more parallel resonators connected in parallel between the input terminal and the output terminal, at least one parallel resonator of the one or more parallel resonators being a second resonator that is another of the first piezoelectric thin film resonator and the second piezoelectric thin film resonator.

According to a second aspect of the present invention, there is provided a piezoelectric thin film resonator including: a substrate; a lower electrode located on the substrate; a lower piezoelectric film located on the lower electrode, an end face of the lower piezoelectric film being inclined so that a width of the lower piezoelectric film becomes narrower from a lower surface of the lower piezoelectric film to an upper surface of the lower piezoelectric film; an upper piezoelectric film located on the lower electrode, an end face of the upper piezoelectric film being not inclined or being inclined so that a width of the upper piezoelectric film becomes wider from a lower surface of the upper piezoelectric film to an upper surface of the upper piezoelectric film, the end face of the upper piezoelectric film being substantially aligned with the end face of the lower piezoelectric film in a boundary face between the upper piezoelectric film and the lower piezoelectric film; and an upper electrode located on the upper piezoelectric film, an end of the upper electrode being substantially aligned with an end of the upper surface of the upper piezoelectric film or being located further out than the end of the upper surface of the upper piezoelectric film.

According to a third aspect of the present invention, there is provided a method of fabricating a piezoelectric thin film resonator, the method including: forming a lower electrode on a substrate; forming a lower piezoelectric film on the lower electrode; forming an upper piezoelectric film on the lower piezoelectric film; forming an upper electrode on the upper piezoelectric film; and etching the upper piezoelectric film and the lower piezoelectric film using the upper electrode as a mask so that an end face of the lower piezoelectric film is inclined so that a width of the lower piezoelectric film becomes narrower from the lower electrode to the upper piezoelectric film, an end face of the upper piezoelectric film is not inclined or is inclined so that a width of the upper piezoelectric film becomes wider from the lower piezoelectric film to the upper electrode, the end face of the lower piezoelectric film is substantially aligned with the end face of the upper piezoelectric film in a boundary face between the lower piezoelectric film and the upper piezoelectric film, an end of the upper electrode is substantially aligned with an end of an upper surface of the upper piezoelectric film or is located further out than the end of the upper surface of the upper piezoelectric film.

DETAILED DESCRIPTION

For example, the filter used for a duplexer is desired to have a steep skirt characteristic between the transmit band and the receive band, a wider band, and a smaller ripple. The Q-value is improved by providing an insertion film to the piezoelectric thin film resonator. However, even when the piezoelectric thin film resonator having an insertion film is used for the ladder-type filter, the above described characteristics are difficult to achieve. Additionally, the use of a resonator different from the series resonator for the parallel resonator increases the number of fabrication steps, thereby increasing cost.

Hereinafter, a description will be given of embodiments with reference to the accompanying drawings.

First Embodiment

Figure 1A:
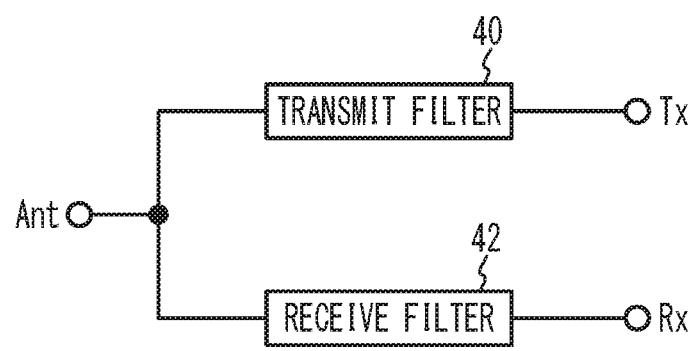
FIG. 1A is a circuit diagram of a duplexer for which a ladder-type filter in accordance with a first embodiment is used.
Figure 1B:
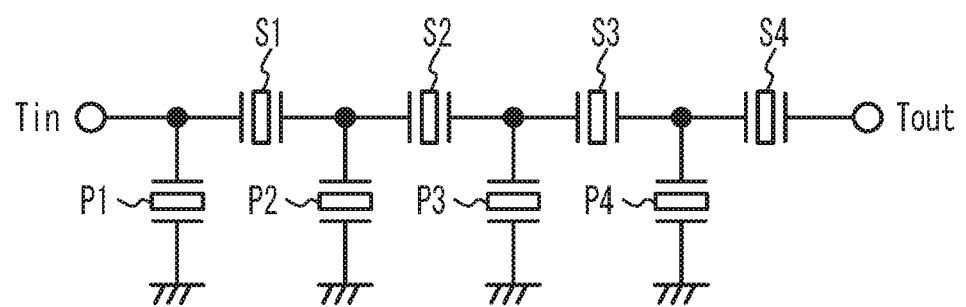
FIG. 1B is a circuit diagram of a ladder-type filter in accordance with the first embodiment.

FIG. 1A is a circuit diagram of a duplexer for which a ladder-type filter in accordance with a first embodiment is used, and FIG. 1B is a circuit diagram of the ladder-type filter in accordance with the first embodiment. As illustrated in FIG. 1A, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant among high-frequency signals input to the transmit terminal Tx, and suppresses signals with other frequencies. The receive filter 42 transmits signals in the receive band to the receive terminal Rx among high-frequency signals input to the common terminal Ant, and suppresses signals with other frequencies.

As illustrated in FIG. 1B, series resonators S1 through S4 are connected in series and parallel resonators P1 through P4 are connected in parallel between an input terminal Tin and an output terminal Tout. The number of series resonators is at least one, and the number of parallel resonators is at least one.

A duplexer for Long Term Evolution (LTE) band3 will be described as an example. The transmit band of band3 is from 1710 MHz to 1785 MHz, and the receive band of band3 is from 1805 MHz to 1880 MHz. The guard band width between the transmit band and the receive band is 20 MHz. On the other hand, the transmit bandwidth and the receive bandwidth are 75 MHz, and the fractional bandwidth, which is the bandwidth with respect to the frequency, is 4.2%, which is large. Thus, in the transmit filter 40, it is desired to make the skirt characteristic at the high frequency side adjacent to the receive band steep, widen the passband, and reduce a ripple occurring in the passband. In the receive filter 42, it is desired to make the skirt characteristic at the low frequency side adjacent to the transmit band steep, widen the passband, and reduce a ripple occurring in the passband.

Although the Q-value improves by providing the insertion film as in Patent Document 1, the electromechanical coupling coefficient decreases. Thus, when a ladder-type filter is formed with a piezoelectric thin film resonator having an insertion film, the skirt characteristic becomes steep, but it is difficult to widen the passband and reduce a ripple.

Thus, in the transmit filter 40, resonators having a high Q-value are used for the series resonators S1 through S4, and resonators having a high electromechanical coupling coefficient are used for the parallel resonators P1 through P4. This configuration makes the skirt characteristic at the high frequency side steep, widens the passband, and reduces a ripple. In the receive filter 42, resonators having a high Q-value are used for the parallel resonators P1 through P4, and resonators having a high electromechanical coupling coefficient are used for the series resonators S1 through S4. This configuration makes the skirt characteristic at the low frequency side steep, widens the passband, and reduces a ripple.

In Patent Documents 3 through 6, the characteristics such as a Q-value and an electromechanical coupling coefficient can be made to be different between the series resonator and the parallel resonator. However, in Patent Documents 3 through 6, the film thicknesses or the film materials are made to be different between the series resonator and the parallel resonator. Thus, the number of fabrication steps increases, and thereby, cost increases.

In Patent Document 2, by making the width of the insertion film in the resonance region of the series resonator different from that of the parallel resonator, the characteristics such as a Q-value and an electromechanical coupling coefficient are made to be different between the series resonator and the parallel resonator. This inhibits the increase in number of fabrication steps. However, since all the piezoelectric thin film resonators have the insertion film, the electromechanical coupling coefficient is not made to be sufficiently high.

Hereinafter, the first embodiment will be described by using the receive filter 42 as an example.

Figure 2:
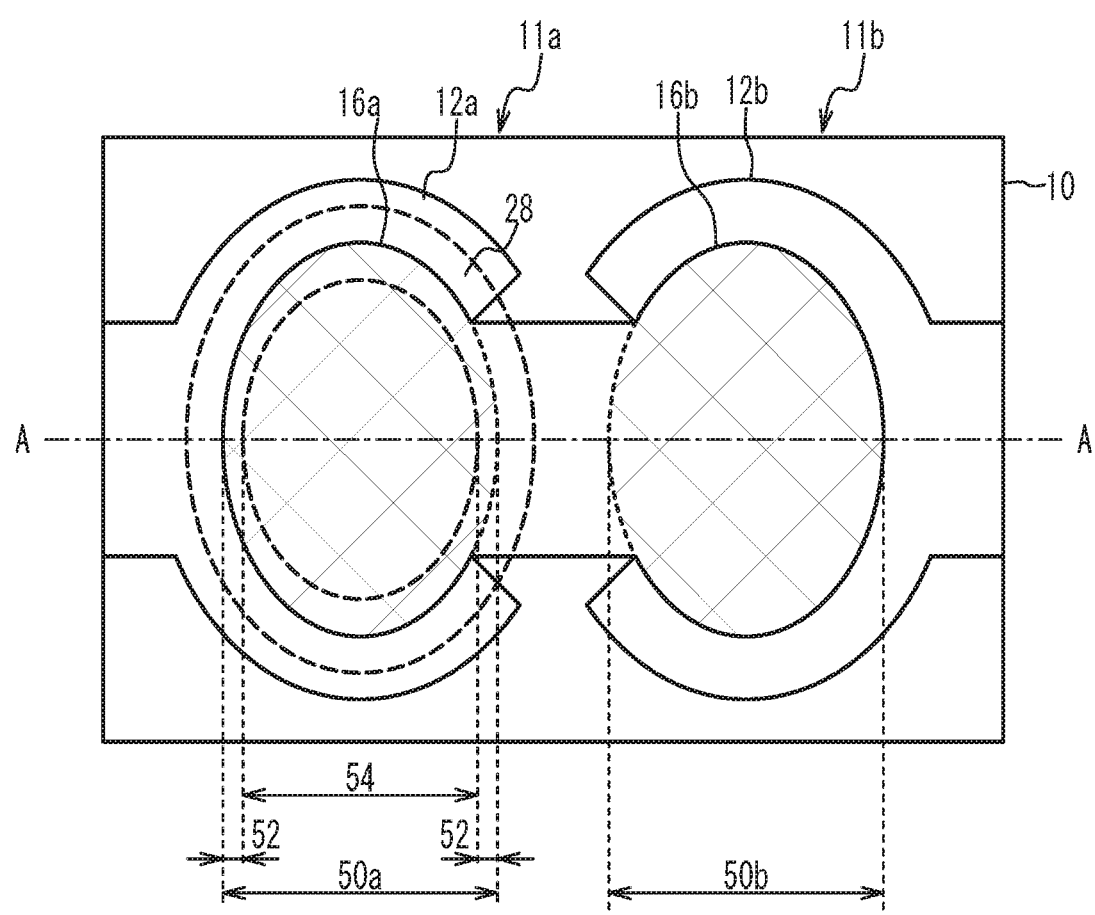
FIG. 2 is a plan view of a series resonator and a parallel resonator of the ladder-type filter in accordance with the first embodiment.
Figure 3:
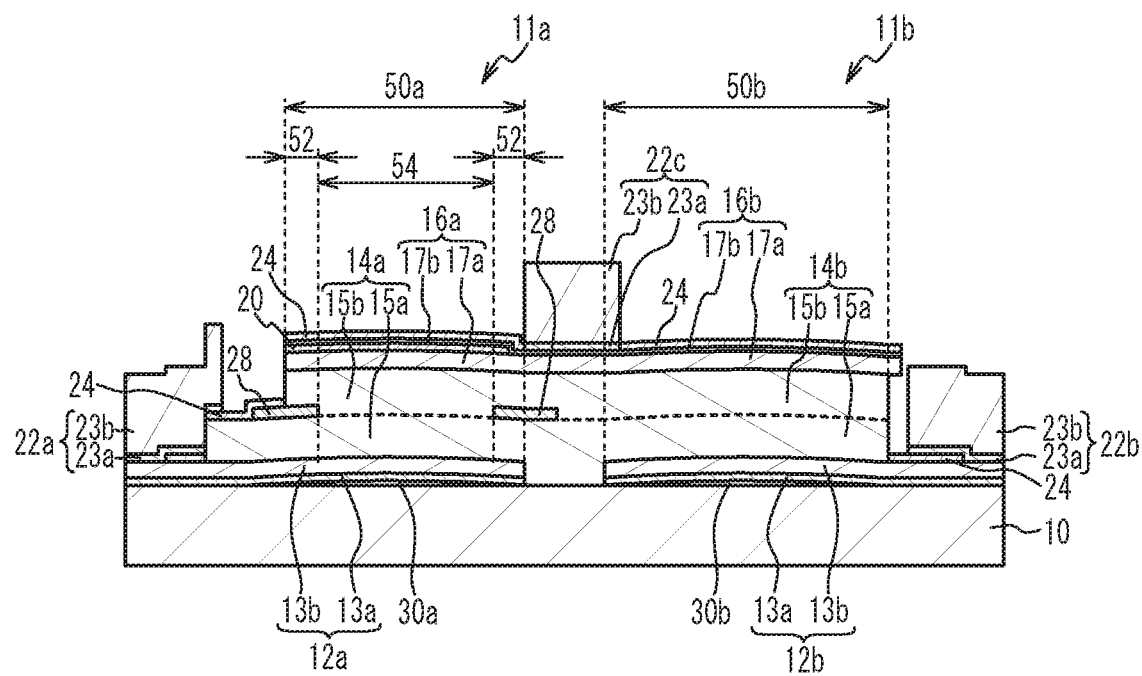
FIG. 3 is a cross-sectional view of the series resonator and the parallel resonator of the ladder-type filter in accordance with the first embodiment.

FIG. 2 is a plan view of a series resonator and a parallel resonator of the ladder-type filter in accordance with the first embodiment. FIG. 2 illustrates a lower electrode, an upper electrode, an insertion film, and a resonance region. FIG. 3 is a cross-sectional view of the series resonator and the parallel resonator of the ladder-type filter of the first embodiment, and corresponds to the cross-section taken along line A-A in FIG. 2.

As illustrated in FIG. 2 and FIG. 3, piezoelectric thin film resonators 11a and 11b are located on a substrate 10. The piezoelectric thin film resonator 11a is a parallel resonator, and the piezoelectric thin film resonator 11b is a series resonator. The piezoelectric thin film resonator 11a includes a lower electrode 12a located on the substrate 10, a piezoelectric film 14a located on the lower electrode 12a, and an upper electrode 16a located on the piezoelectric film 14a. The piezoelectric thin film resonator 11b includes a lower electrode 12b located on the substrate 10, a piezoelectric film 14b located on the lower electrode 12b, and an upper electrode 16b located on the piezoelectric film 14b. A protective film 24 is located on the upper electrodes 16a and 16b. The protective film 24 is also located on a part of each of the lower electrodes 12a and 12b, a part of the lower piezoelectric film 15a, and a part of the insertion film 28. A metal layer 22a is located on the lower electrode 12a, a metal layer 22b is located on the lower electrode 12b, and a metal layer 22c is located on the upper electrode 16b. The metal layers 22a through 22c function as wiring lines or pads. An air gap 30a is located between the upper surface of the substrate 10 and the lower electrode 12a, and an air gap 30b is located between the upper surface of the substrate 10 and the lower electrode 12b. The air gaps 30a and 30b are dome-shaped.

Each of the lower electrodes 12a and 12b includes a lower layer 13a and an upper layer 13b located on the lower layer 13a. Each of the piezoelectric films 14a and 14b includes a lower piezoelectric film 15a and an upper piezoelectric film 15b located on the lower piezoelectric film 15a. Each of the upper electrodes 16a and 16b includes a lower layer 17a and an upper layer 17b located on the lower layer 17a. Each of the metal layers 22a through 22c includes a lower layer 23a and an upper layer 23b located on the lower layer 23a.

The region where the upper electrode 16a and the lower electrode 12a face each other across at least a part of the piezoelectric film 14a is a resonance region 50a. The region where the upper electrode 16b and the lower electrode 12b face each other across at least a part of the piezoelectric film 14b is a resonance region 50b. The resonance regions 50a and 50b are regions in which an acoustic wave in the thickness extension mode resonates. The resonance region 50a is included in the air gap 30a in plan view, and the resonance region 50b is included in the air gap 30b in plan view.

The piezoelectric thin film resonator 11a has an insertion film 28 located between the lower piezoelectric film 15a and the upper piezoelectric film 15b. The piezoelectric thin film resonator 11b has no insertion film 28. The insertion film 28 is located in an outer peripheral region 52 within the resonance region 50a and is not located in a center region 54. The center region 54 is a region including the center of the resonance region 50a. The planar shape of the insertion film 28 is a ring shape or a partly-cut ring shape. The insertion film 28 may be located between the lower electrode 12a and the piezoelectric film 14a, or may be located between the piezoelectric film 14a and the upper electrode 16a. That is, it is sufficient if the insertion film 28 is inserted between the lower electrode 12a and the upper electrode 16a.

The insertion film 28 inhibits the acoustic wave energy from leaking from the resonance region 50a. Thus, the Q-value is improved. In the extraction region of the lower electrode 12a, the end face of the lower piezoelectric film 15a is located further out than the end face of the upper piezoelectric film 15b. This structure improves the Q-value.

A mass load film 20 is located between the lower layer 17a and the upper layer 17b of the piezoelectric thin film resonator 11a that becomes a parallel resonator. The mass load film 20 is not located in the piezoelectric thin film resonator 11b that becomes a series resonator. The mass load film 20 is a film for making the resonant frequencies of the series resonator and the parallel resonator different from each other.

The substrate 10 is, for example, a silicon (Si) substrate. The substrate 10 may be, a sapphire substrate, a spinel substrate, an alumina substrate, a quartz substrate, a glass substrate, a ceramic substrate, or a GaAs substrate instead of an S1 substrate.

The lower layer 13a and the upper layer 13b in each of the lower electrodes 12a and 12b are, for example, a chrome (Cr) film and a ruthenium (Ru) film, respectively. The lower layer 17a and the upper layer 17b in each of the upper electrodes 16a and 16b are, for example, an Ru film and a Cr film, respectively. The lower electrodes 12a and 12b and the upper electrodes 16a and 16b may be formed of a single-layer film of aluminum (Al), titanium (Ti), copper (Cu), molybdenum (Mo), tungsten (W), tantalum (Ta), platinum (Pt), rhodium (Rh), or iridium (Jr) or a multilayered film of at least two of them instead of Ru and Cr.

The piezoelectric films 14a and 14b are, for example, aluminum nitride films mainly composed of aluminum nitride (AlN) having the main axis in the (002) direction. The piezoelectric films 14a and 14b may be made of zinc oxide (ZnO), lead zirconate titanate (PZT), or lead titanate (PbTiO$_3$) instead of aluminum nitride. Alternatively, for example, the piezoelectric films 14a and 14b may be mainly composed of aluminum nitride, and may contain other elements for improving the resonance characteristic or the piezoelectricity. For example, the use of scandium (Sc), a Group II or Group XII element and a Group IV element, a Group II or Group XII element and a Group V element as additive elements improves the piezoelectricity of the piezoelectric films 14a and 14b. Accordingly, the effective electromechanical coupling coefficient of the piezoelectric thin film resonator is improved. The Group II element is, for example, calcium (Ca), magnesium (Mg), or strontium (Sr), and the Group XII element is, for example, zinc (Zn). The Group IV element is, for example, Ti, zirconium (Zr), or hafnium (Hf). The Group V element is, for example, Ta, niobium (Nb), or vanadium (V). Yet alternatively, the piezoelectric films 14a and 14b may be mainly composed of aluminum nitride and contain boron (B).

The insertion film 28 is made of a material having a Young's modulus less than that of the piezoelectric film 14a and/or acoustic impedance less than that of the piezoelectric film 14a. The insertion film 28 may be a single-layer film of aluminum (Al), gold (Au), Cu, Ti, Pt, Ta, or Cr, or a multilayered film of at least two of them instead of silicon oxide.

The mass load film 20 is, for example, a Ti film. Instead of a Ti film, the metal films or the insulating films exemplified for the lower electrodes 12a and 12b and the upper electrodes 16a and 16b can be used. The protective film 24 is, for example, a silicon oxide (SiO$_2$) film. The protective film 24 may be an insulating film such as a silicon nitride film or a silicon oxynitride film instead of a silicon oxide film. The lower layer 23a and the upper layer 23b of each of the metal layers 22a through 22c are, for example, a Ti film and an Au film, respectively. The lower layer 23a is a layer for improving the adhesiveness, and the upper layer 23b may be a Cu layer or an Al layer having a low resistance.

Fabrication Method of the First Embodiment

Figure 4A:
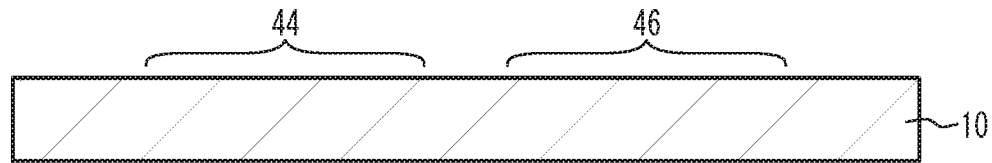
FIG. 4A through FIG. 4D are cross-sectional views (No. 1) illustrating a method of fabricating the ladder-type filter in accordance with the first embodiment.

FIG. 4A through FIG. 7C are cross-sectional views illustrating a method of fabricating the ladder-type filter in accordance with the first embodiment. As illustrated in FIG. 4A, the substrate 10 is prepared. A region 44 is a region where the piezoelectric thin film resonator 11a, which is a parallel resonator, is to be formed, and a region 46 is a region where the piezoelectric thin film resonator 11b, which is a series resonator, is to be formed.

Figure 4B:
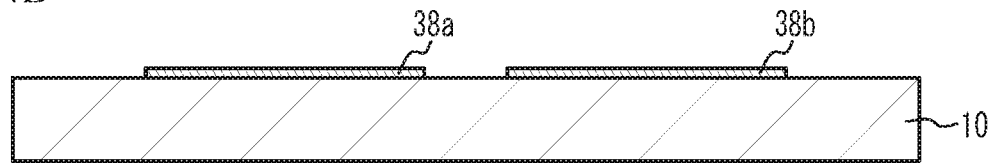

As illustrated in FIG. 4B, sacrifice layers 38a and 38b are formed on the substrate 10 by, for example, sputtering, vacuum evaporation, or chemical vapor deposition (CVD). The sacrifice layers 38a and 38b are formed of, for example, magnesium oxide (MgO) films. The sacrifice layers 38a and 38b may be formed of ZnO films, Ge films, or silicon oxide films. Each of the sacrifice layers 38a and 38b has a film thickness of, for example, 10 to 100 nm. The sacrifice layers 38a and 38b are patterned into desired shapes by, for example, photolithography and etching. The sacrifice layers 38a and 38b may be formed by vacuum evaporation and liftoff.

Figure 4C:
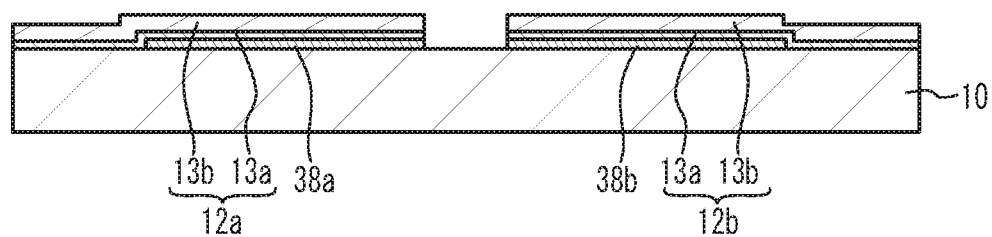

As illustrated in FIG. 4C, the lower layer 13a and the upper layer 13b are formed on the substrate 10 so as to cover each of the sacrifice layers 38a and 38b by, for example, sputtering, vacuum evaporation, or CVD. The lower layer 13a and the upper layer 13b are patterned into desired shapes by, for example, photolithography and etching. This process forms the lower electrodes 12a and 12b in the regions 44 and 46, respectively. The lower electrodes 12a and 12b may be formed by vacuum evaporation and liftoff.

Figure 4D:
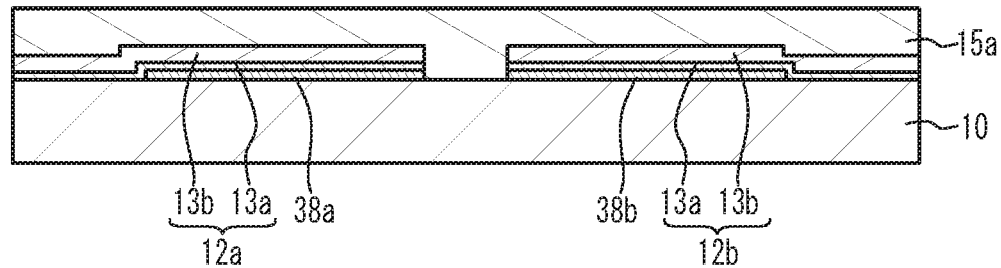

As illustrated in FIG. 4D, the lower piezoelectric film 15a is formed on the substrate 10 so as to cover the lower electrodes 12a and 12b by, for example, sputtering, vacuum evaporation, or CVD.

Figure 5A:
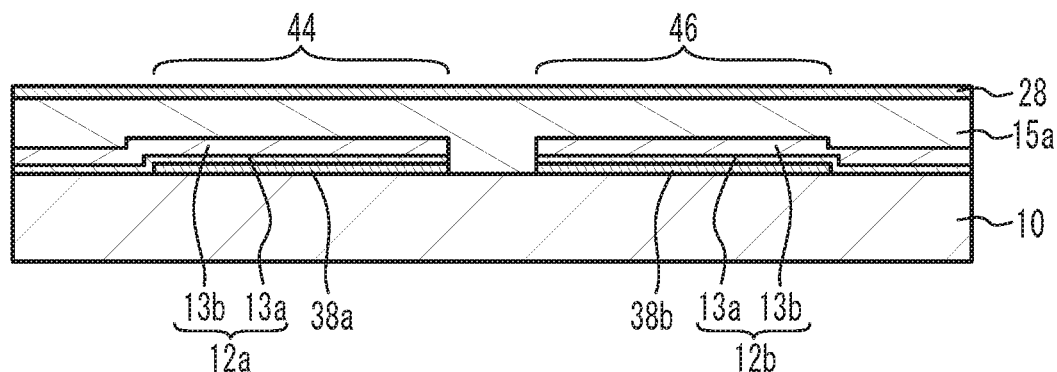
FIG. 5A through FIG. 5C are cross-sectional views (No. 2) illustrating the method of fabricating the ladder-type filter in accordance with the first embodiment.
Figure 5B:
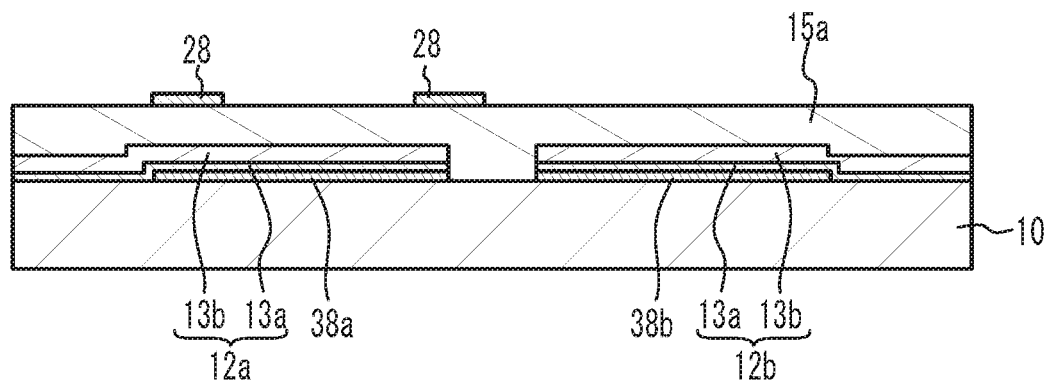

As illustrated in FIG. 5A, the insertion film 28 is formed on the lower piezoelectric film 15a by sputtering, vacuum evaporation, or CVD. As illustrated in FIG. 5B, the insertion film 28 is patterned into a desired shape by, for example, photolithography and etching. This process forms the insertion film 28 in the region 44 and forms no insertion film 28 in the region 46. The insertion film 28 may be formed by vacuum evaporation and liftoff.

Figure 5C:
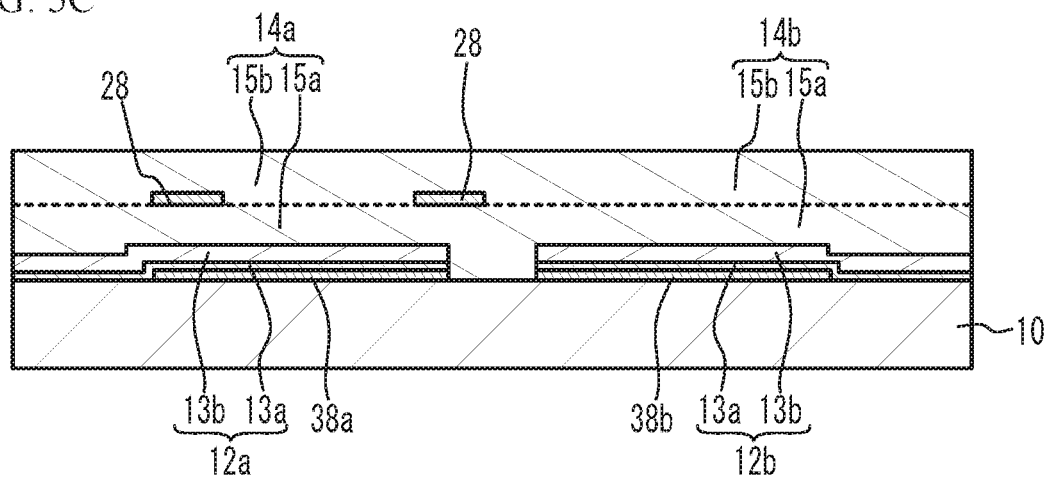

As illustrated in FIG. 5C, the upper piezoelectric film 15b is formed on the lower piezoelectric film 15a so as to cover the insertion film 28 by, for example, sputtering, vacuum evaporation, or CVD. This process forms the piezoelectric films 14a and 14b in the regions 44 and 46, respectively.

Figure 6A:
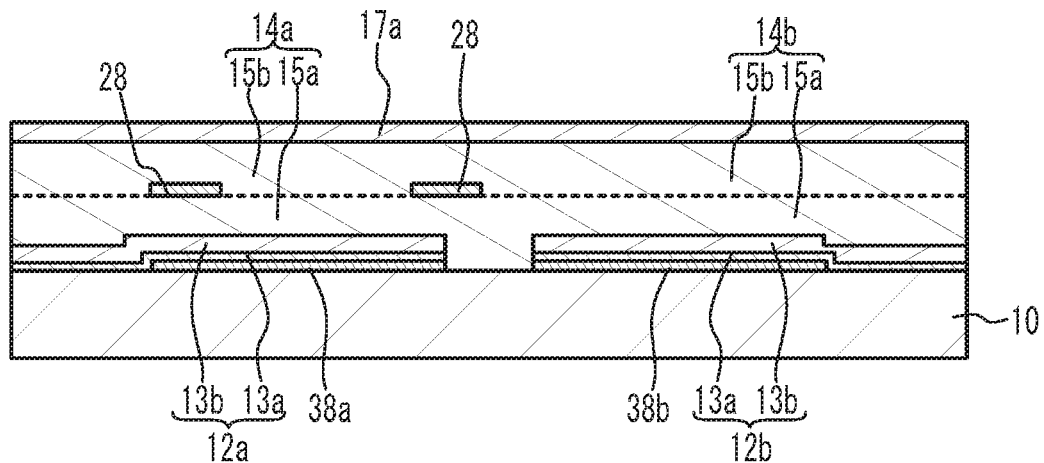
FIG. 6A through FIG. 6C are cross-sectional views (No. 3) illustrating the method of fabricating the ladder-type filter in accordance with the first embodiment.
Figure 6B:
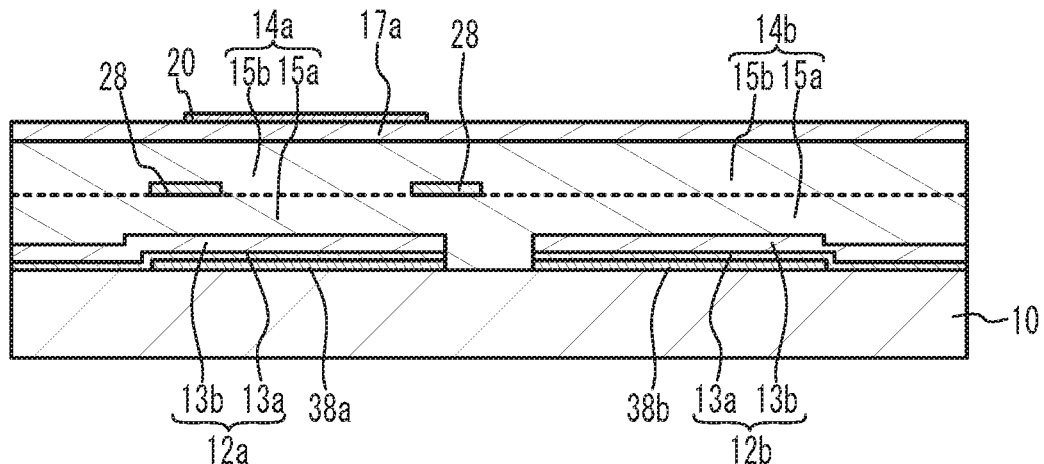

As illustrated in FIG. 6A, the lower layer 17a is formed on the upper piezoelectric film 15b by, for example, sputtering, vacuum evaporation, or CVD. As illustrated in FIG. 6B, the mass load film 20 is formed on the lower layer 17a by, for example, sputtering, vacuum evaporation, or CVD. The mass load film 20 is patterned into a desired shape by, for example, photolithography and etching. This process forms the mass load film 20 in the region 44 and forms no mass load film 20 in the region 46. The mass load film 20 may be formed by vacuum evaporation and liftoff.

Figure 6C:
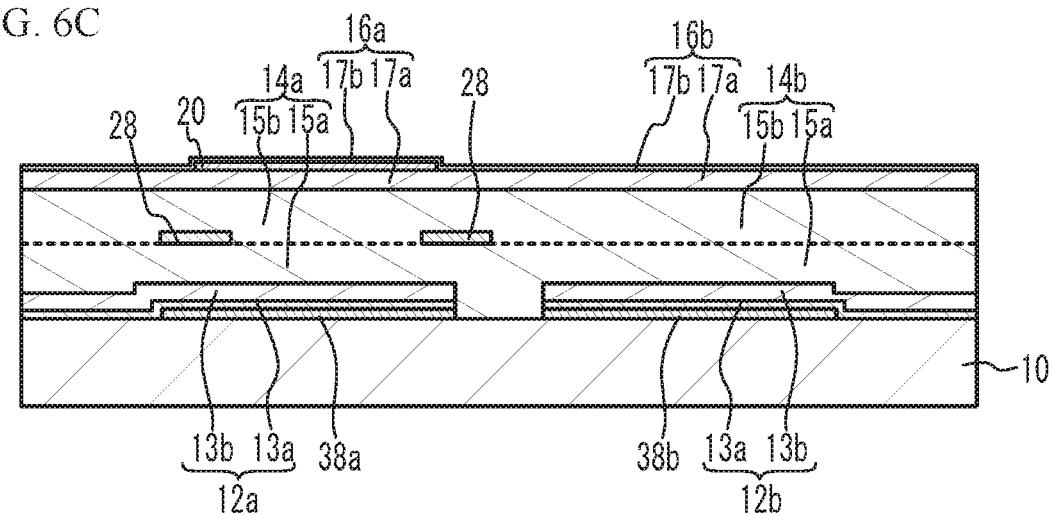

As illustrated in FIG. 6C, the upper layer 17b is formed on the lower layer 17a so as to cover the mass load film 20 by, for example, sputtering, vacuum evaporation, or CVD. This process forms the upper electrodes 16a and 16b in the regions 44 and 46, respectively.

Figure 7A:
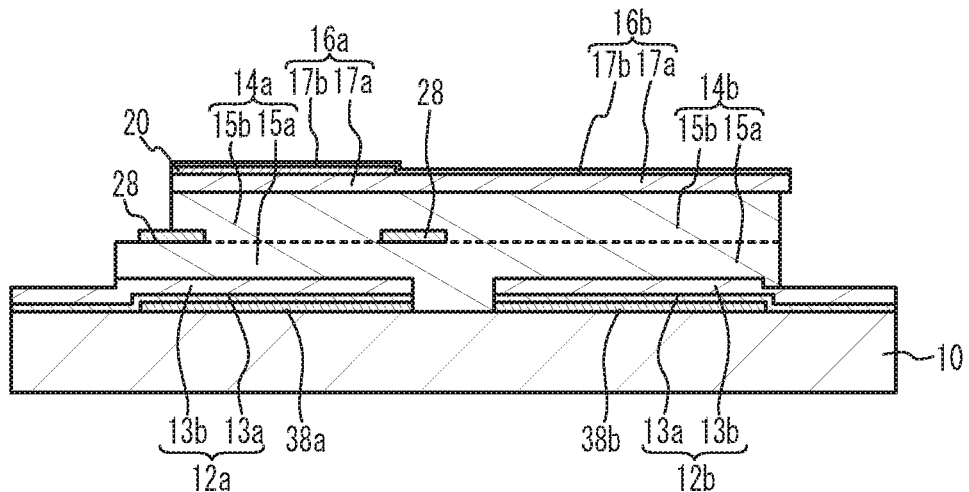
FIG. 7A through FIG. 7C are cross-sectional views (No. 4) illustrating the method of fabricating the ladder-type filter in accordance with the first embodiment.

As illustrated in FIG. 7A, the upper layer 17b and the lower layer 17a are patterned into desired shapes by, for example, photolithography and etching. The upper piezoelectric film 15b and the lower piezoelectric film 15a are patterned into desired shapes by, for example, etching. At this time, the upper piezoelectric film 15b and the lower piezoelectric film 15a are etched using, for example, the upper electrodes 16a and 16b and the insertion film 28 as a mask. When the upper piezoelectric film 15b and the lower piezoelectric film 15a are aluminum nitride films, for example, a phosphoric acid solution is used as an etching liquid.

Figure 7B:
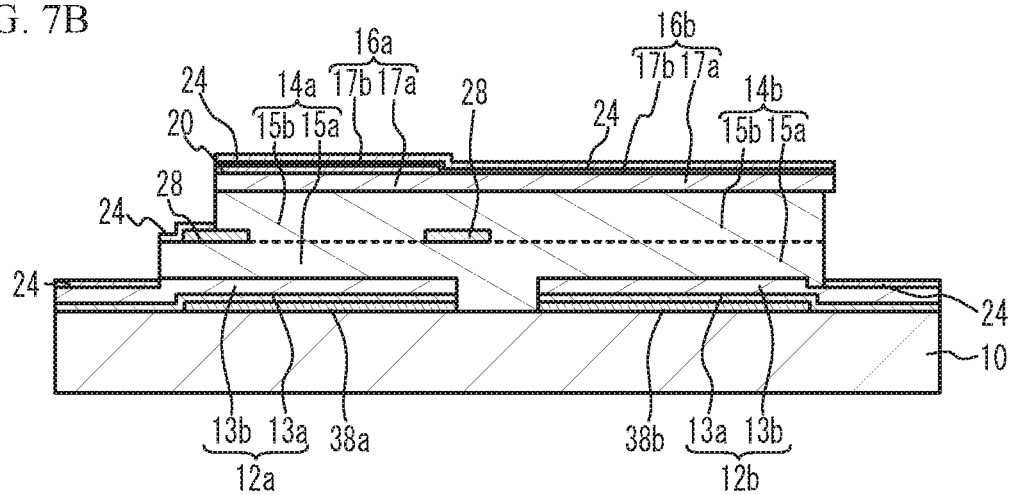
Figure 7C:
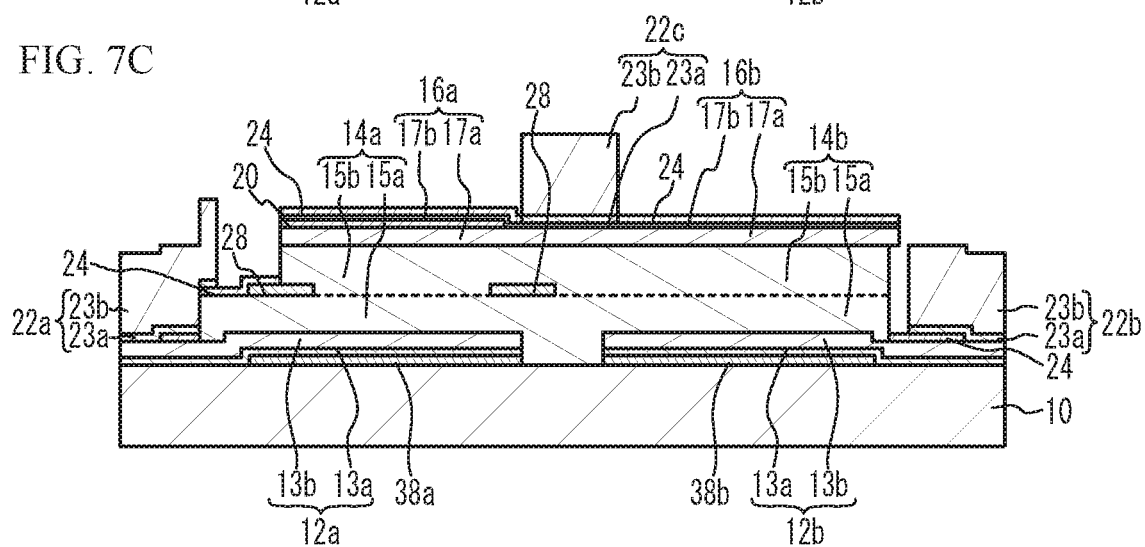

As illustrated in FIG. 7B, the protective film 24 is formed so as to cover the upper electrodes 16a and 16b by, for example, sputtering, vacuum evaporation, or CVD. As illustrated in FIG. 7C, after removing a part of the protective film 24, the metal layers 22a through 22c are respectively formed on the lower electrodes 12a and 12b and the upper electrode 16b by vacuum evaporation and liftoff.

Thereafter, the sacrifice layers 38a and 38b are removed by an etching liquid. By setting the total internal stress of the lower electrodes 12a and 12b, the piezoelectric films 14a and 14b, and the upper electrodes 16a and 16b to be a compression stress, the lower electrodes 12a and 12b bulge out to the opposite side to the substrate 10 so as to separate from the substrate 10. The air gaps 30a and 30b having a dome-shaped bulge are formed between the lower electrodes 12a and 12b and the substrate 10, respectively. The above processes form the piezoelectric thin film resonators 11a and 11b illustrated in FIG. 3.

Experiment 1

The piezoelectric thin film resonators 11a and 11b were fabricated. The fabrication conditions are as follows.

Lower layer 13a: Cr film with a film thickness of 100 nm
Upper layer 13b: Ru film with a film thickness of 200 nm
Lower piezoelectric film 15a: AlN film with a film thickness of 500 nm
Upper piezoelectric film 15b: AlN film with a film thickness of 500 nm
Insertion film 28: $SiO_2$ film with a film thickness of 100 nm
Lower layer 17a: Ru film with a film thickness of 200 nm
Upper layer 17b: Cr film with a film thickness of 50 nm
Mass load film 20: Ti film with a film thickness of 100 nm
Protective film 24: $SiO_2$ film with a film thickness of 70 nm The piezoelectric thin film resonator 11b has no insertion film 28.

The Q-values and the electromechanical coupling coefficients of the fabricated piezoelectric thin film resonators 11a and 11b were measured. Measurement results are as follows.

Piezoelectric Thin Film Resonator 11a (with the Insertion Film 28)
Q-value at the resonant frequency: 2000
Q-value at the antiresonant frequency: 1700
Electromechanical coupling coefficient: 6.8%

Piezoelectric Thin Film Resonator 11b (without the Insertion Film 28)
Q-value at the resonant frequency: 1800
Q-value at the antiresonant frequency: 1100
Electromechanical coupling coefficient: 7.0%

The piezoelectric thin film resonator 11a having the insertion film 28 has a higher Q-value and a smaller electromechanical coupling coefficient than the piezoelectric thin film resonator 11b having no insertion film 28.

Simulation 1

Based on the measurement results of the piezoelectric thin film resonators 11a and 11b in experiment 1, the transmission characteristic of the ladder-type filter was simulated. The circuit diagram of the simulated ladder-type filter is the same as the circuit diagram of FIG. 1B. The ladder-type filter was assumed to be the receive filter 42 for LTE band25 (the receive band is from 1930 MHz to 1995 MHz). In the first embodiment, the piezoelectric thin film resonator 11a having the insertion film 28 was used for the parallel resonators P1 through P4, and the piezoelectric thin film resonator 11b having no insertion film 28 was used for the series resonators S1 through S4. In the first comparative example, the piezoelectric thin film resonator 11a having the insertion film 28 was used for the parallel resonators P1 through P4 and the series resonators S1 through S4.

In the parallel resonators P1 through P4, the mass load film 20 was assumed to be a Ti film with a film thickness of 100 nm, an Ru film with a film thickness of 10 nm, and a Ti film with a film thickness of 20 nm stacked in this order from the lower layer 17a side. In the series resonators S1 through S4, the mass load film 20 was assumed to be an Ru film with a film thickness of 10 nm and a Ti film with a film thickness of 20 nm stacked in this order from the lower layer 17a side. The materials and the film thicknesses of other layers were assumed to be the same as those of experiment 1. The bandwidth was configured to be substantially the same between the first embodiment and the first comparative example.

Figure 8:
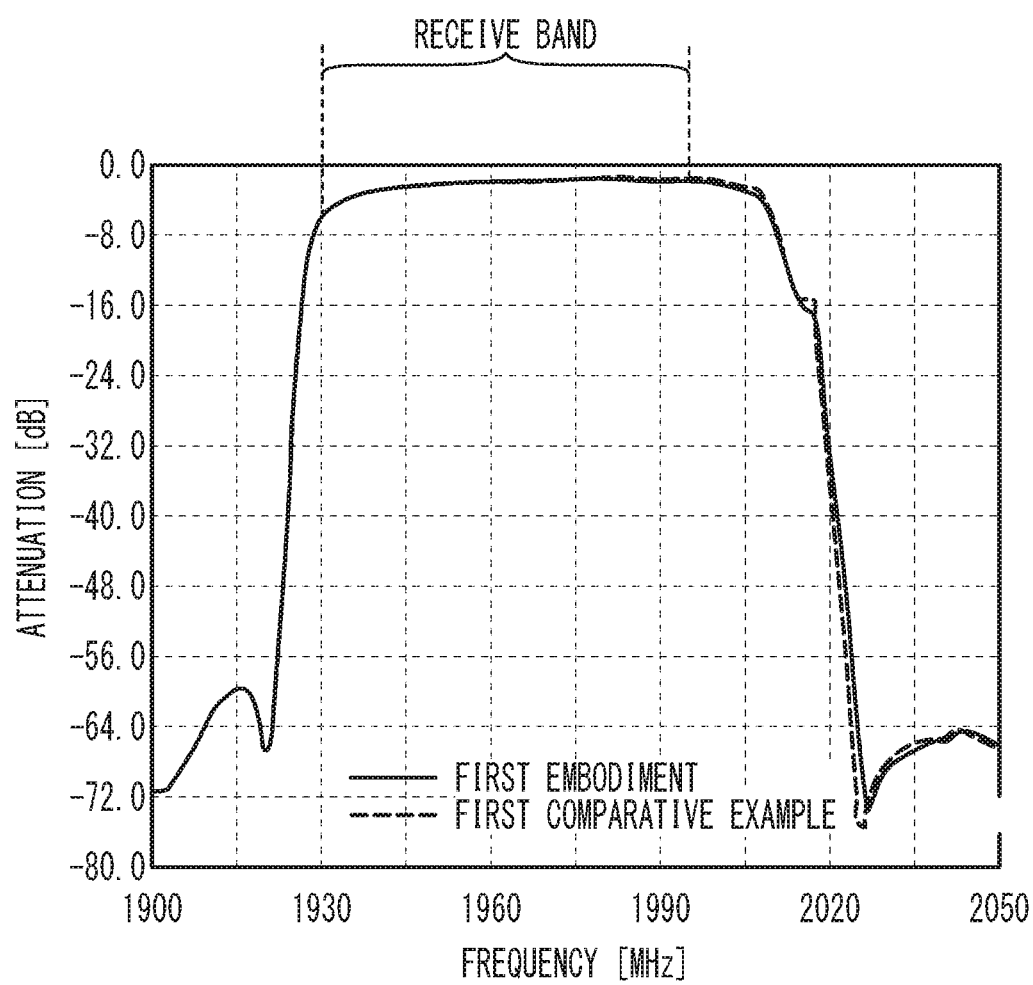
FIG. 8 illustrates the passbands of the ladder-type filters in accordance with the first embodiment and a first comparative example.
Figure 9A:
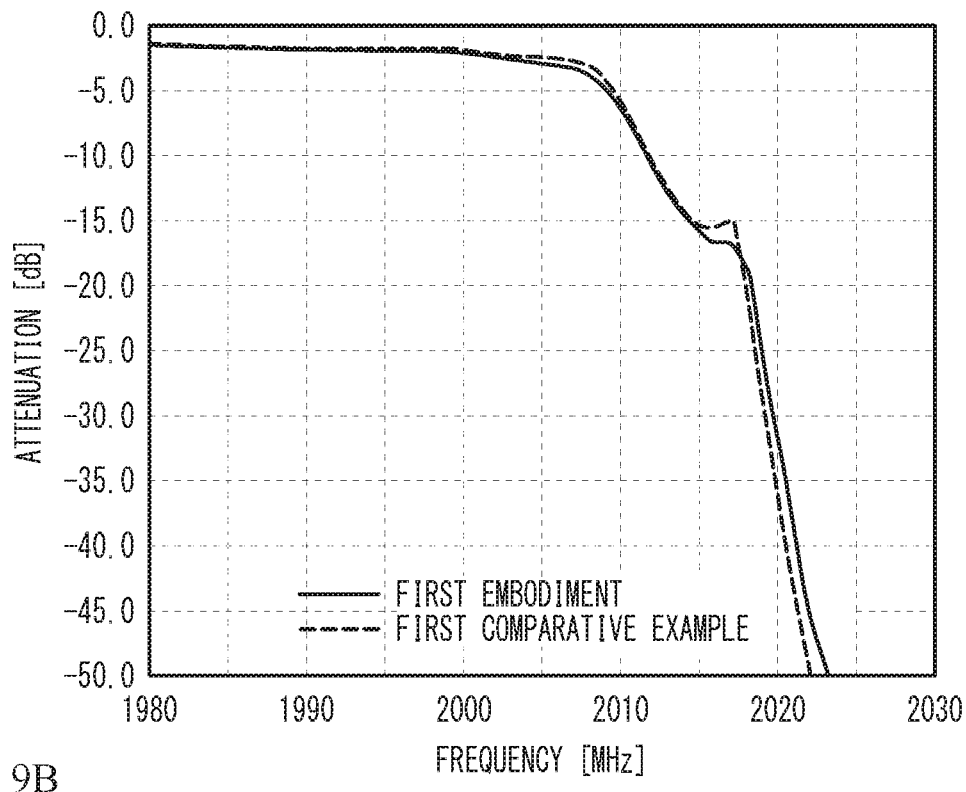
FIG. 9A and FIG. 9B illustrate the passbands of the ladder-type filters in accordance with the first embodiment and the first comparative example.
Figure 9B:
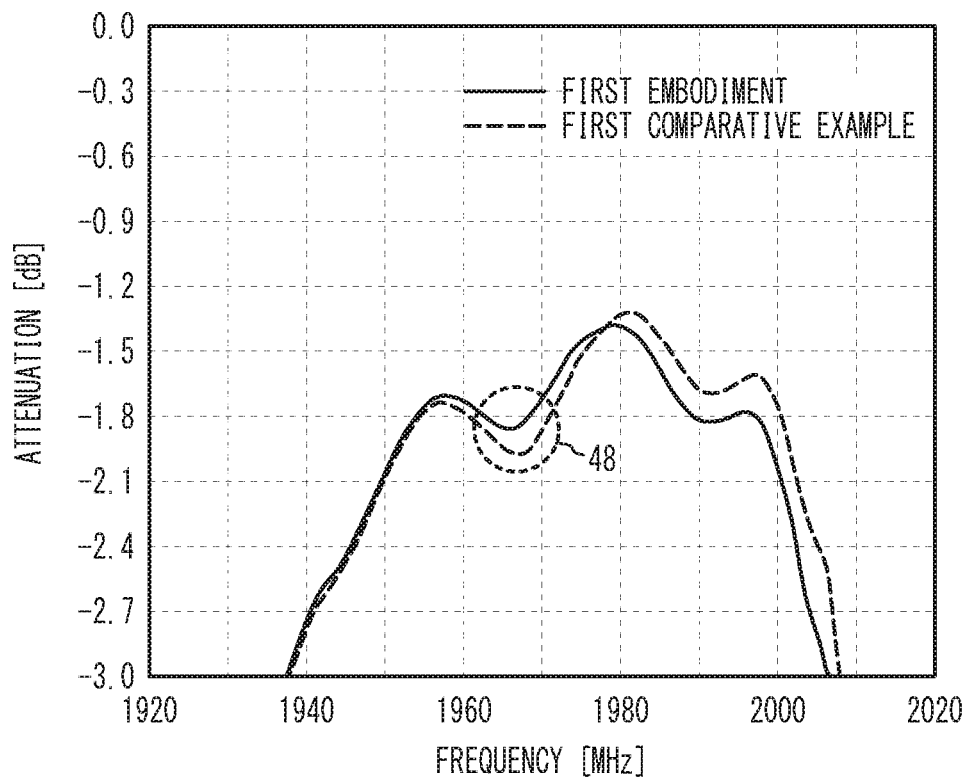

FIG. 8 through FIG. 9B illustrate passbands of the ladder-type filters in accordance with the first embodiment and the first comparative example. As illustrated in FIG. 8, since the parallel resonators P1 through P4 of the first embodiment and the first comparative example have the insertion film 28, the skirt characteristic at the low frequency side is steep. As illustrated in FIG. 9A, since the series resonators S1 through S4 of the first embodiment have no insertion film 28, the skirt characteristic at the high frequency side of the first embodiment is gentler than that of the first comparative example.

As illustrated in FIG. 9B, as in a region 48, a ripple in the first embodiment is smaller than a ripple in the first comparative example. In the ladder-type filter, when the band is widened, the ripple in the passband becomes large. When the ripple in the passband is made to be smaller, the band narrows. In this simulation, the first embodiment and the first comparative example were assumed to have substantially the same bandwidth. In this case, a ripple in the first embodiment can be made to be smaller than a ripple in the first comparative example.

In the first embodiment, the piezoelectric thin film resonator 11a (a first piezoelectric thin film resonator) includes the lower electrode 12a (a first lower electrode), the piezoelectric film 14a (a first piezoelectric film), the upper electrode 16a (a first upper electrode), and the insertion film 28. The piezoelectric thin film resonator 11b (a second piezoelectric thin film resonator) includes the lower electrode 12b (a second lower electrode), the piezoelectric film 14b (a second piezoelectric film), and the upper electrode 16b (a second upper electrode), and has no insertion film 28.

One or more parallel resonators P1 through P4 are the piezoelectric thin film resonators 11a having the insertion film 28, and one or more series resonators S1 through S4 are the piezoelectric thin film resonators 11b having no insertion film 28.

This configuration achieves the ladder-type filter that has a steep skirt characteristic at the low-frequency side, a wider band, and a smaller ripple as in simulation 1. Since the number of fabrication steps does not increase unlike Patent Documents 3 through 6, the fabrication cost is reduced. Since the electromechanical coupling coefficients of the series resonators S1 through S4 can be made to be larger than those in Patent Document 2, the ladder-type filter with a further wider band and a further smaller ripple is achieved.

One or more series resonators S1 through S4 may be the piezoelectric thin film resonators 11a having the insertion film 28, and one or more parallel resonators P1 through P4 may be the piezoelectric thin film resonators 11b having no insertion film 28. This configuration achieves the ladder-type filter that has a steep skirt characteristic at the high frequency side, a wider band, and a smaller ripple. Such a ladder-type filter is preferably used for, for example, the transmit filter 40.

When the receive band is lower than the transmit band, it is preferable that the parallel resonators P1 through P4 are configured to be the piezoelectric thin film resonator 11a and the series resonators S1 through S4 are configured to be the piezoelectric thin film resonator 11b in the transmit filter 40, and the series resonators S1 through S4 are preferably configured to be the piezoelectric thin film resonator 11a and the parallel resonators P1 through P4 are preferably configured to be the piezoelectric thin film resonator 11b in the receive filter 42.

That is, it is sufficient if all the one or more series resonators S1 through S4 are configured to be a first resonator, which is one of the piezoelectric thin film resonator 11a and the piezoelectric thin film resonator 11b, and all the one or more parallel resonators P1 through P4 are configured to be a second resonator, which is the other of the piezoelectric thin film resonator 11a and the piezoelectric thin film resonator 11b.

Alternatively, at least one of the series resonators S1 through S4 may be the first resonator, and the remaining series resonators of the series resonators S1 through S4 and all the parallel resonators P1 through P4 may be the second resonator. Yet alternatively, at least one of the parallel resonators P1 through P4 is the second resonator, and the remaining parallel resonators of the parallel resonators P1 through P4 and all the series resonators S1 through S4 may be the first resonator. Yet alternatively, it is sufficient if at least one of the series resonators S1 through S4 is the first resonator, and at least one of the parallel resonators P1 through P4 is the second resonator.

Each of the piezoelectric film 14a and the piezoelectric film 14b includes the lower piezoelectric film 15a and the upper piezoelectric film 15b, and the insertion film 28 is inserted between the lower piezoelectric film 15a and the upper piezoelectric film 15b. This configuration allows the piezoelectric thin film resonators 11a and 11b to be formed through the same fabrication process. Thus, the production cost is reduced.

Since the piezoelectric thin film resonators 11a and 11b are fabricated through the same fabrication process, the lower electrodes 12a and 12b are preferably made of the same material and have substantially the same film thickness. The piezoelectric films 14a and 14b are preferably made of the same material and have substantially the same film thickness. The upper electrodes 16a and 16b are preferably made of the same material and have substantially the same film thickness.

First Variation of the First Embodiment

Figure 10A:
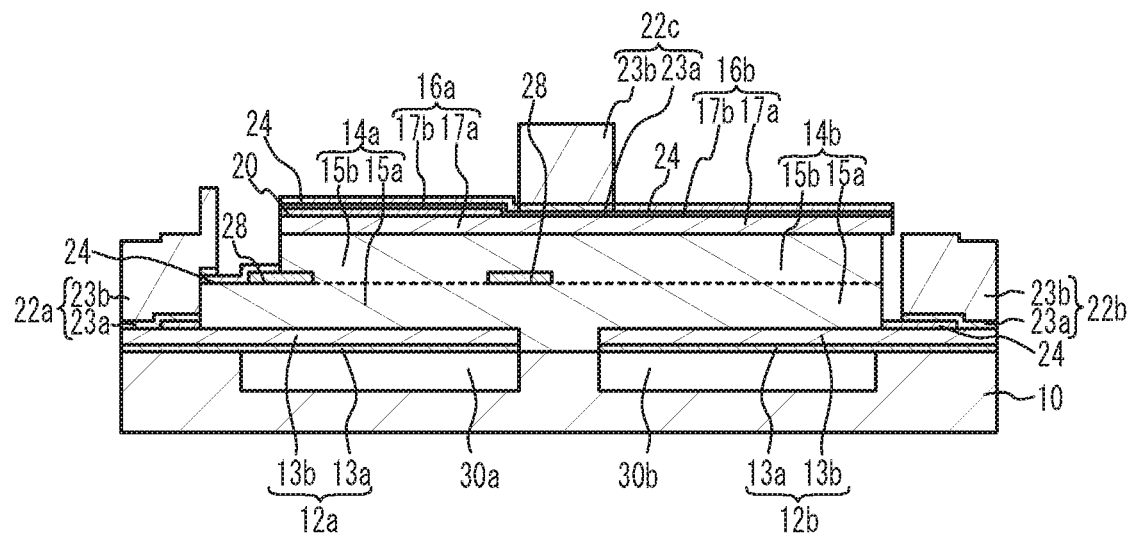
FIG. 10A and FIG. 10B are cross-sectional views of the series resonator and the parallel resonator of ladder-type filters in accordance with first and second variations of the first embodiment, respectively.

A first variation of the first embodiment changes the structure of the air gap. FIG. 10A is a cross-sectional view of the series resonator and the parallel resonator of a ladder-type filter in accordance with the first variation of the first embodiment. As illustrated in FIG. 10A, recessed portions are formed on the upper surface of the substrate 10. The lower electrodes 12a and 12b are flatly formed on the substrate 10. This forms the air gaps 30a and 30b in the recessed portions of the substrate 10. The air gaps 30a and 30b are formed so as to include the resonance regions 50a and 50b, respectively. Other structures are the same as those of the first embodiment, and the description thereof is thus omitted. The air gaps 30a and 30b may be formed so as to penetrate through the substrate 10.

Second Variation of the First Embodiment

Figure 10B:
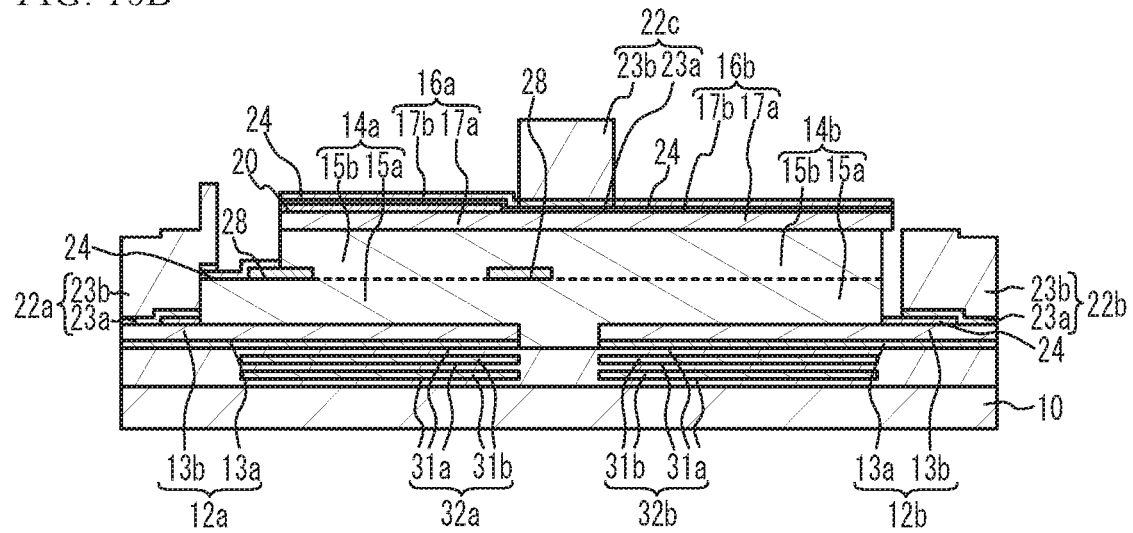

FIG. 10B is a cross-sectional view of the series resonator and the parallel resonator of a ladder-type filter in accordance with a second variation of the first embodiment. As illustrated in FIG. 10B, acoustic mirrors 32a and 32b are formed under the lower electrodes 12a and 12b in the resonance regions 50a and 50b, respectively. Each of the acoustic mirrors 32a and 32b is formed of films 31a with low acoustic impedance and films 31b with high acoustic impedance alternately stacked. Each of the films 31a and 31b has a film thickness of, for example, $\lambda/4$ ($\lambda$ is the wavelength of the acoustic wave). The number of the films 31a and 31b that are stacked can be freely selected. It is sufficient if each of the acoustic mirrors 32a and 32b is formed of two layers with different acoustic characteristics stacked at an interval. Alternatively, the substrate 10 may be one of two layers with different acoustic characteristics of each of the acoustic mirrors 32a and 32b. For example, each of the acoustic mirrors 32a and 32b may have a structure in which a single-layer film with acoustic impedance different from that of the substrate 10 is located in the substrate 10. Other structures are the same as those of the first embodiment, and the description thereof is thus omitted.

In the first embodiment, the air gaps 30a and 30b may be formed as in the first variation of the first embodiment, or the acoustic mirrors 32a and 32b may be formed instead of the air gaps 30a and 30b in the second variation of the first embodiment.

As in the first embodiment and the first variation of the embodiment, the piezoelectric thin film resonators 11a and 11b may be Film Bulk Acoustic Resonators (FBARs) in which the air gaps 30a and 30b are formed between the substrate 10 and the lower electrodes 12a and 12b in the resonance regions 50a and 50b, respectively. Alternatively, as in the second variation of the first embodiment, the piezoelectric thin film resonators 11a and 11b may be Solidly Mounted Resonators (SMRs) including the acoustic mirrors 32a and 32b, which reflect acoustic waves propagating through the piezoelectric films 14a and 14b, under the lower electrodes 12a and 12b in the resonance regions 50a and 50b, respectively.

Third Variation of the First Embodiment

Figure 11:
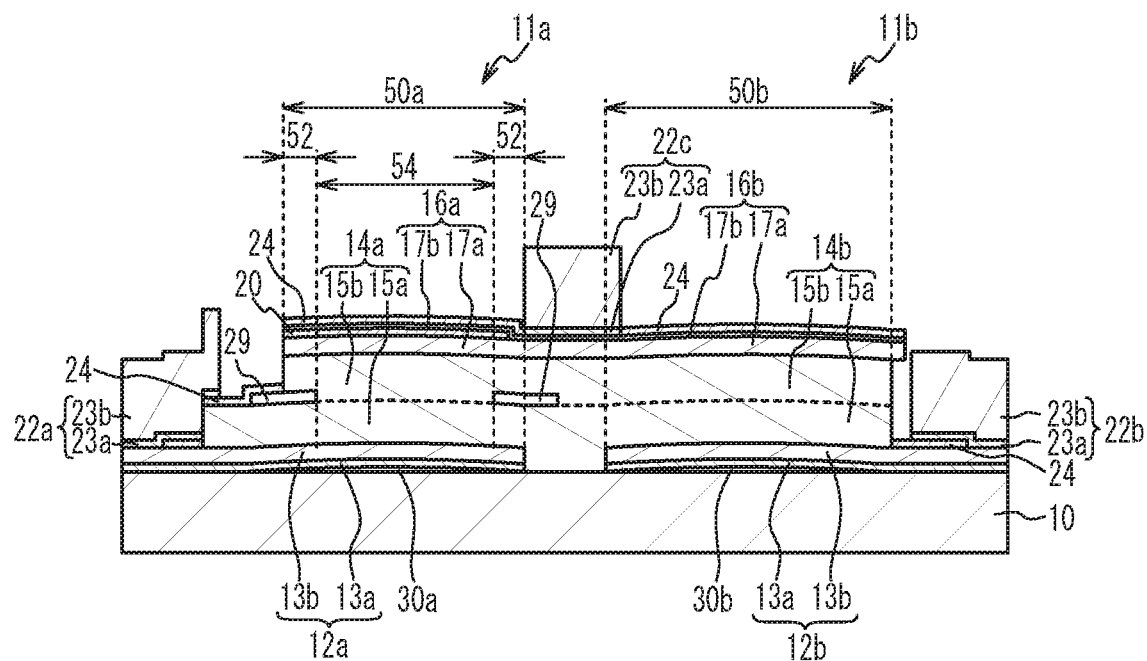
FIG. 11 is a cross-sectional view of the series resonator and the parallel resonator of a ladder-type filter in accordance with a third variation of the first embodiment.

FIG. 11 is a cross-sectional view of the series resonator and the parallel resonator of a ladder-type filter in accordance with a third variation of the first embodiment. As illustrated in FIG. 11, the insertion film 28 may not be necessarily in a solid state, and may be an air gap 29 without a substance. Other structures are the same as those of the first embodiment, and the description thereof is thus omitted.

The first embodiment and the variations thereof have described that the planar shapes of the resonance regions 50a and 50b are elliptical shapes, but the planar shapes may be polygonal shapes such as quadrangle shapes or pentagonal shapes.

The example in which the ladder-type filters in accordance with the first embodiment and the variations thereof are used for the duplexer has been described, but the ladder-type filters in accordance with the first embodiment and the variations thereof may be used for a multiplexer such as a triplexer or a quadplexer. Alternatively, the ladder-type filters in accordance with the first embodiment and the variations thereof may be used for other than the multiplexer.

Second Embodiment

Figure 12A:
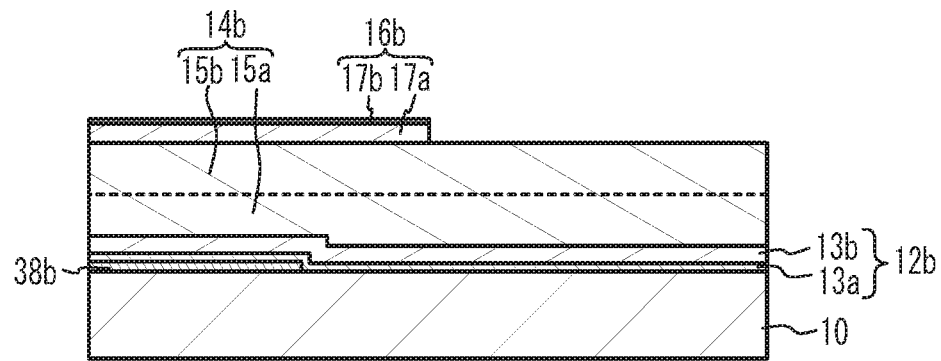
FIG. 12A through FIG. 12D are cross-sectional views illustrating a method of fabricating a piezoelectric thin film resonator in accordance with a second embodiment.

FIG. 12A through FIG. 12D are cross-sectional views illustrating a method of fabricating a piezoelectric thin film resonator in accordance with a second embodiment, and illustrate the step of etching the piezoelectric film 14b using the upper electrode 16b as a mask in FIG. 7A. As illustrated in FIG. 12A, the upper electrode 16b is formed on the piezoelectric film 14b.

Figure 12B:
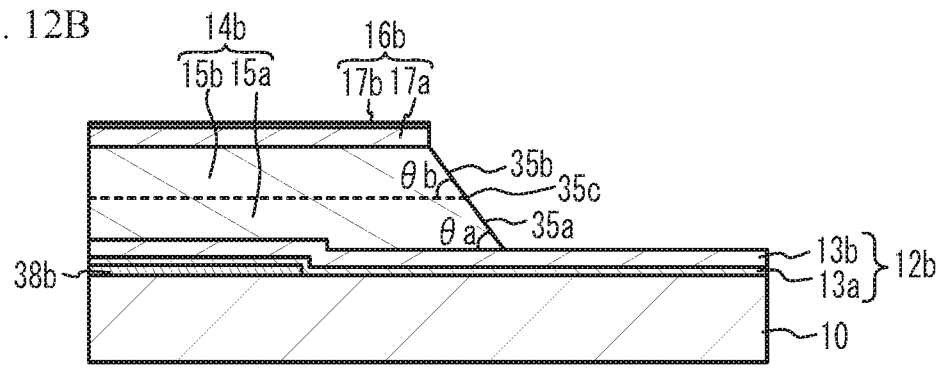

As illustrated in FIG. 12B, the piezoelectric film 14b is etched by using the upper electrode 16b as a mask. The piezoelectric film 14b is an aluminum nitride film, and an etching liquid is a phosphoric acid solution. An end face 35a of the lower piezoelectric film 15a and an end face 35b of the upper piezoelectric film 15b are etched so as to be inclined. In early phase of etching, the inner angle θa between the upper surface of the lower electrode 12b and the end face 35a and the inner angle θb between the upper surface of the lower piezoelectric film 15a and the end face 35b are substantially the same, and are acute angles. The end face 35a and the end face 35b are substantially aligned with each other in a boundary face 35c between the end faces 35a and 35b.

Figure 12C:
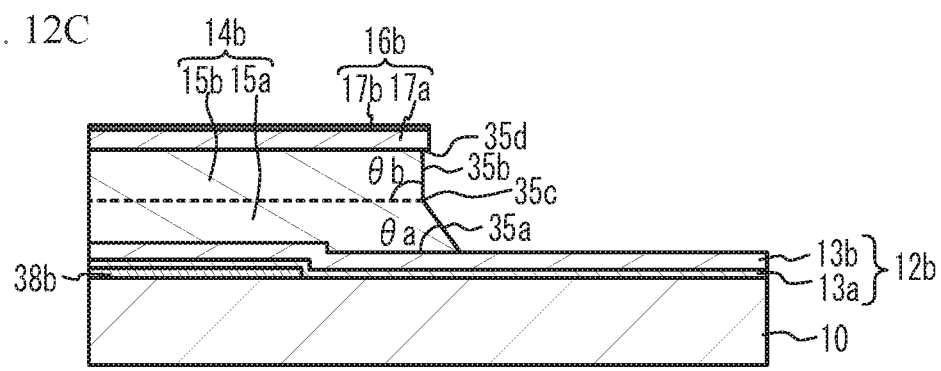

As illustrated in FIG. 12C, as etching progresses, the etching rate of the upper piezoelectric film 15b decreases in a boundary face 35d between the upper piezoelectric film 15b and the upper electrode 16b, and etching progresses in the boundary face 35c and the end face 35a. Accordingly, the inner angle θb becomes greater than the inner angle θa. For example, the inner angle θb becomes approximately 90°.

Figure 12D:
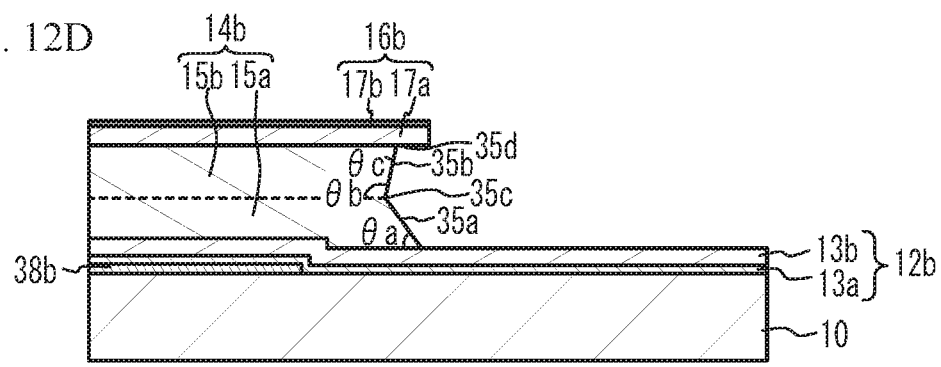

As illustrated in FIG. 12D, as etching further progresses, the end face 35b becomes located further in than the end of the upper electrode 16b. The inner angle θb becomes obtuse. The inner angle θc between the upper surface of the upper piezoelectric film 15b and the end face 35b becomes smaller than the inner angle θb. The inner angle θa is smaller than, for example, the inner angle θc.

In the piezoelectric thin film resonator 11b having no insertion film 28, the end of the upper surface of the piezoelectric film 14b is configured to be located further in than the end of the lower surface of the upper electrode 16b. This structure inhibits the acoustic wave from leaking to the substrate 10, thereby improving the Q-value. Since the end of the upper surface of the piezoelectric film 14b is configured to be located further in than the end of the lower surface of the upper electrode 16b, the shape illustrated in FIG. 12C or FIG. 12D is achieved.

Figure 13:
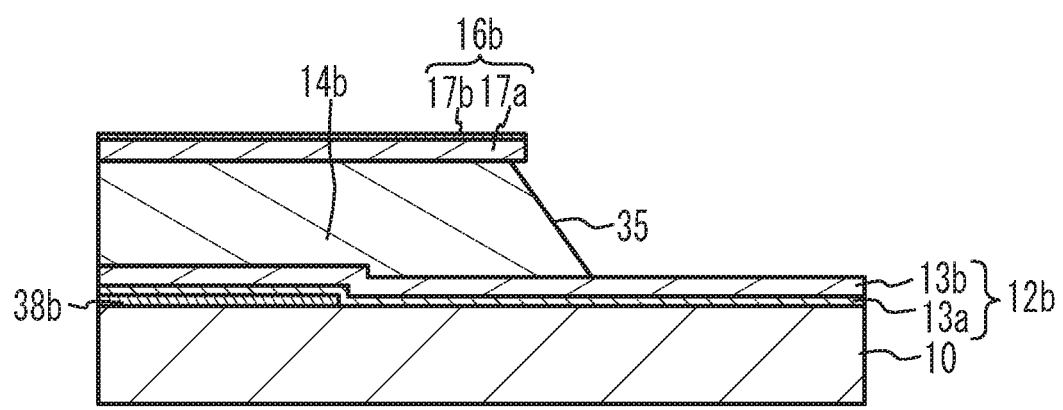
FIG. 13 is a cross-sectional view of a piezoelectric thin film resonator in a second comparative example.

FIG. 13 is a cross-sectional view of a piezoelectric thin film resonator in a second comparative example. As illustrated in FIG. 13, in the second comparative example, the piezoelectric film 14b is a single film, and formed at one time. In the second comparative example, even when the piezoelectric film 14b is etched so that the end of the upper surface of the piezoelectric film 14b is located further in than the end of the lower surface of the upper electrode 16b, an end face 35 of the piezoelectric film 14b is substantially planate.

In FIG. 12C and FIG. 12D, the reason why the etching progresses in the boundary face 35c is considered because when the surface of the lower piezoelectric film 15a is exposed to air to form the insertion film 28 after formation of the lower piezoelectric film 15a and the upper piezoelectric film 15b is then formed, the upper piezoelectric film 15b contains many impurities and/or has bad crystallinity.

Simulation 2

Figure 14A:
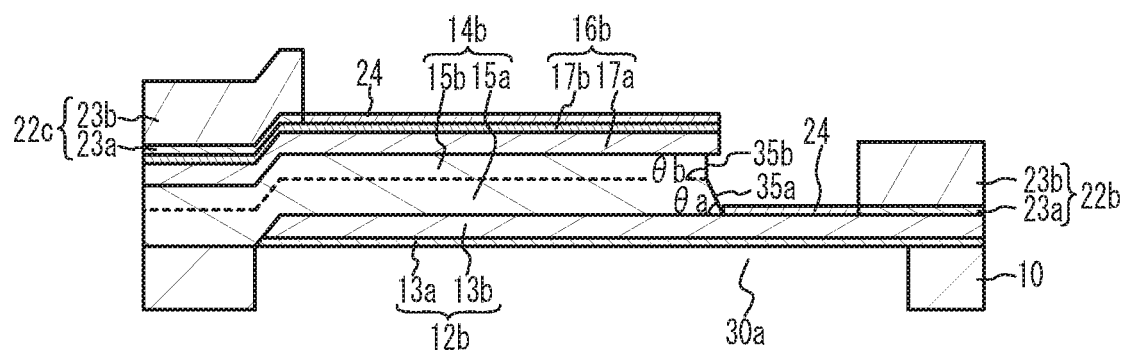
FIG. 14A and FIG. 14B are cross-sectional views of piezoelectric thin film resonators in accordance with the second embodiment and a third comparative example, respectively.
Figure 14B:
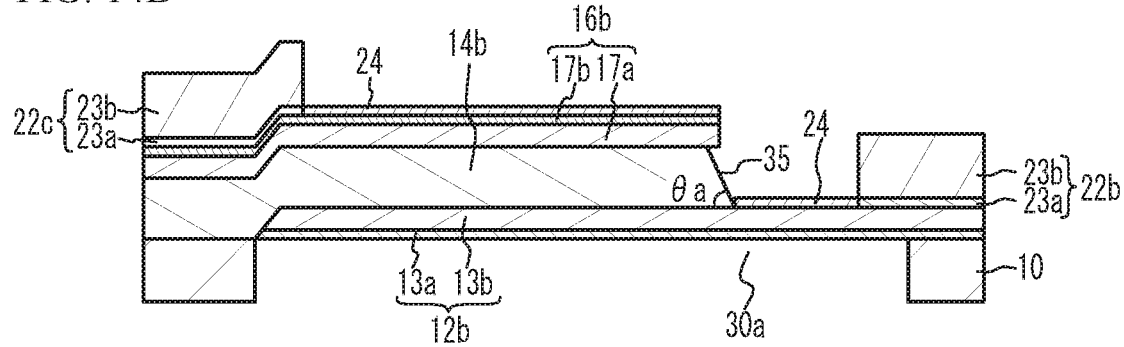

The Q-values of the piezoelectric thin film resonators 11b in the second embodiment and a third comparative example were simulated. FIG. 14A and FIG. 14B are cross-sectional views of piezoelectric thin film resonators in accordance with the second embodiment and the third comparative example, respectively, and illustrate simulated structures. As illustrated in FIG. 14A, in the second embodiment, the air gap 30a penetrates through the substrate 10. The lower electrode 12b, the piezoelectric film 14b, and the upper electrode 16b are flat. The inner angle θa between the upper surface of the lower electrode 12b and the end face 35a of the lower piezoelectric film 15a is an acute angle, and the inner angle θb between the upper surface of the lower piezoelectric film 15a and the end face 35b of the upper piezoelectric film 15b is substantially a right angle. Other structures are the same as those of the first embodiment, and the description thereof is thus omitted.

As illustrated in FIG. 14B, in the third comparative example, the piezoelectric film 14b is a single film. The inner angle θa between the upper surface of the lower electrode 12b and the end face 35 of the piezoelectric film 14b is an acute angle, and the end face 35 is planate.

Simulation conditions of individual layers are as follows.
Lower layer 13a: Cr film with a film thickness of 100 nm
Upper layer 13b: Ru film with a film thickness of 200 nm
Piezoelectric film 14b: AlN film with a film thickness of 1000 nm
Lower layer 17a: Ru film with a film thickness of 300 nm
Upper layer 17b: Cr film with a film thickness of 40 nm
Protective film 24: SiO$_2$ film with a film thickness of 70 nm
Lower layer 23a: Ti film with a film thickness of 100 nm
Upper layer 23b: Au film with a film thickness of 600 nm
Inner angle θa: 60°
Inner angle θb: 90°

The Q-value at the antiresonant frequency in each of the second embodiment and the third comparative example is as follows.

Second embodiment: 1330
Third comparative example: 1270

As presented above, the second embodiment has an improved Q-value compared to the third comparative example. Since the piezoelectric thin film resonator 11b of the second embodiment has no insertion film 28, the Q-value is improved without deteriorating the electromechanical coupling coefficient.

In the second embodiment, in the piezoelectric thin film resonator 11b having no insertion film 28, the end face 35a of the lower piezoelectric film 15a is inclined so that the lower piezoelectric film 15a becomes narrower from the lower electrode 12b to the upper piezoelectric film 15b. The end face 35b of the upper piezoelectric film 15b is not inclined or is inclined so that the upper piezoelectric film 15b becomes wider from the lower piezoelectric film 15a to the upper electrode 16b. In the boundary face between the lower piezoelectric film 15a and the upper piezoelectric film 15b, the end face 35a of the lower piezoelectric film 15a is substantially aligned with the end face 35b of the upper piezoelectric film 15b. The end of the upper electrode 16b is aligned with the end of the upper surface of the upper piezoelectric film 15b or is located further out than the end of the upper surface of the upper piezoelectric film 15b. Accordingly, the Q-value is improved without using the insertion film 28.

In addition, the inner angle θa between the upper surface of the lower electrode 12b and the end face 35a of the lower piezoelectric film 15a is smaller than the inner angle θb between the upper surface of the lower piezoelectric film 15a and the end face 35b of the upper piezoelectric film 15b. This configuration further improves the Q-value.

The lower piezoelectric film 15a is formed on the lower electrode 12b. The upper piezoelectric film 15b is formed on the lower piezoelectric film 15a. The upper electrode 16b is formed on the upper piezoelectric film 15b. Thereafter, the upper piezoelectric film 15b and the lower piezoelectric film 15a are etched using the upper electrode 16b as a mask. This process forms the end faces 35a and 35b as illustrated in FIG. 12B and FIG. 12C.

The use of the piezoelectric thin film resonator of the second embodiment for the piezoelectric thin film resonator 11b having no insertion film 28 of the ladder-type filter of the first embodiment improves the Q-value of the piezoelectric thin film resonator 11b. In addition, since the number of fabrication steps does not increase, the production cost is reduced.

The piezoelectric thin film resonator of the second embodiment may be fabricated alone. In this case, the surface of the lower piezoelectric film 15a is preferably exposed to air before the step for forming the upper piezoelectric film 15b. This configuration forms the end faces 35a and 35b as illustrated in FIG. 12B and FIG. 12C.

Although the embodiments of the present invention have been described in detail, it is to be understood that the various change, substitutions, and alterations could be made hereto without departing from the spirit and scope of the invention.

What is claimed is:

1. A ladder-type filter comprising:
   a substrate;
   a first piezoelectric thin film resonator including a first lower electrode located on the substrate, a first piezoelectric film located on the first lower electrode, a first upper electrode located on the first piezoelectric film, and an insertion film inserted between the first lower electrode and the first upper electrode, the insertion film being located in an outer peripheral region of a first resonance region in which the first lower electrode and the first upper electrode face each other across at least a part of the first piezoelectric film, the insertion film being not located in a center region of the first resonance region;
   a second piezoelectric thin film resonator including a second lower electrode located on the substrate, a second piezoelectric film located on the second lower electrode, and a second upper electrode located on the second piezoelectric film, the second piezoelectric thin film resonator having no insertion film between the second lower electrode and the second upper electrode in a second resonance region in which the second lower electrode and the second upper electrode face each other across at least a part of the second piezoelectric film;
   one or more series resonators connected in series between an input terminal and an output terminal, at least one series resonator of the one or more series resonators being a first resonator that is one of the first piezoelectric thin film resonator and the second piezoelectric thin film resonator; and
   one or more parallel resonators connected in parallel between the input terminal and the output terminal, at least one parallel resonator of the one or more parallel resonators being a second resonator that is another of the first piezoelectric thin film resonator and the second piezoelectric thin film resonator.

2. The ladder-type filter according to claim 1, wherein the at least one series resonator is the first resonator, and a series resonator other than the at least one series resonator of the one or more series resonators and all the one or more parallel resonators are the second resonator.

3. The ladder-type filter according to claim 1, wherein the at least one parallel resonator is the second resonator, and a parallel resonator other than the at least one parallel resonator of the one or more parallel resonators and all the one or more series resonators are the first resonator.

4. The ladder-type filter according to claim 1, wherein all the one or more series resonators are the first resonator, and all the one or more parallel resonators are the second resonator.

5. The ladder-type filter according to claim 1, wherein each of the first piezoelectric film and the second piezoelectric film includes a lower piezoelectric film and an upper piezoelectric film located on the lower piezoelectric film, and
the insertion film is inserted between the lower piezoelectric film and the upper piezoelectric film.

6. The ladder-type filter according to claim 5, wherein in the second piezoelectric thin film resonator,
an end face of the lower piezoelectric film is inclined so that the lower piezoelectric film becomes narrower from the second lower electrode to the upper piezoelectric film,
an end face of the upper piezoelectric film is not inclined or is inclined so that the upper piezoelectric film becomes wider from the lower piezoelectric film to the second upper electrode,
in a boundary face between the lower piezoelectric film and the upper piezoelectric film, the end face of the lower piezoelectric film is substantially aligned with the end face of the upper piezoelectric film, and
an end of the second upper electrode is aligned with an end of an upper surface of the upper piezoelectric film or is located further out than the end of the upper surface of the upper piezoelectric film.

7. The ladder-type filter according to claim 6, wherein in the second piezoelectric thin film resonator,
an inner angle between an upper surface of the second lower electrode and the end face of the lower piezoelectric film is smaller than an inner angle between an upper surface of the lower piezoelectric film and the end face of the upper piezoelectric film.

8. A piezoelectric thin film resonator comprising:
a substrate;
a lower electrode located on the substrate;
a lower piezoelectric film located on the lower electrode, an end face of the lower piezoelectric film being inclined so that a width of the lower piezoelectric film becomes narrower from a lower surface of the lower piezoelectric film to an upper surface of the lower piezoelectric film;
an upper piezoelectric film located on the lower electrode, an end face of the upper piezoelectric film being not inclined or being inclined so that a width of the upper piezoelectric film becomes wider from a lower surface of the upper piezoelectric film to an upper surface of the upper piezoelectric film, the end face of the upper piezoelectric film being substantially aligned with the end face of the lower piezoelectric film in a boundary face between the upper piezoelectric film and the lower piezoelectric film; and
an upper electrode located on the upper piezoelectric film, an end of the upper electrode being substantially aligned with an end of the upper surface of the upper piezoelectric film or being located further out than the end of the upper surface of the upper piezoelectric film.

9. A method of fabricating a piezoelectric thin film resonator, the method comprising:
forming a lower electrode on a substrate;
forming a lower piezoelectric film on the lower electrode;
forming an upper piezoelectric film on the lower piezoelectric film;
forming an upper electrode on the upper piezoelectric film; and
etching the upper piezoelectric film and the lower piezoelectric film using the upper electrode as a mask so that an end face of the lower piezoelectric film is inclined so that a width of the lower piezoelectric film becomes narrower from the lower electrode to the upper piezoelectric film, an end face of the upper piezoelectric film is not inclined or is inclined so that a width of the upper piezoelectric film becomes wider from the lower piezoelectric film to the upper electrode, the end face of the lower piezoelectric film is substantially aligned with the end face of the upper piezoelectric film in a boundary face between the lower piezoelectric film and the upper piezoelectric film, an end of the upper electrode is substantially aligned with an end of an upper surface of the upper piezoelectric film or is located further out than the end of the upper surface of the upper piezoelectric film.

10. The method according to claim 9, further comprising exposing a surface of the lower piezoelectric film to air before the forming of the upper piezoelectric film.

* * * * *